(12) United States Patent
Omura

(10) Patent No.: US 9,398,734 B2
(45) Date of Patent: Jul. 19, 2016

(54) COMPONENT MOUNTING SUBSTRATE AND METHOD OF MANAGING COMPONENT MOUNTING SUBSTRATE

(71) Applicant: NICHIA CORPORATION, Anan-shi, Tokushima (JP)

(72) Inventor: Shingo Omura, Sagamihara (JP)

(73) Assignee: NICHIA CORPORATION, Anan-Shi (JP)

( * ) Notice: Subject to any disclaimer, the term of this patent is extended or adjusted under 35 U.S.C. 154(b) by 209 days.

(21) Appl. No.: 14/099,716

(22) Filed: Dec. 6, 2013

(65) Prior Publication Data

US 2014/0160714 A1    Jun. 12, 2014

(30) Foreign Application Priority Data

Dec. 8, 2012   (JP) .................. 2012-268887

(51) Int. Cl.
| | |
|---|---|
| G06F 1/16 | (2006.01) |
| H05K 5/00 | (2006.01) |
| H05K 7/00 | (2006.01) |
| H05K 13/04 | (2006.01) |
| H05K 1/18 | (2006.01) |
| B65D 73/02 | (2006.01) |

(52) U.S. Cl.
CPC ............... *H05K 13/04* (2013.01); *H05K 1/189* (2013.01); *B65D 73/02* (2013.01); *H05K 2201/051* (2013.01); *H05K 2201/10106* (2013.01)

(58) Field of Classification Search
CPC .................................... G06F 1/1652
USPC ............... 361/679.21, 807; 455/575.1–575.9
See application file for complete search history.

(56) References Cited

U.S. PATENT DOCUMENTS

| | | | | |
|---|---|---|---|---|
| 6,498,597 | B1* | 12/2002 | Sawano .............. | G09F 11/29 345/107 |
| 6,771,232 | B2* | 8/2004 | Fujieda .............. | G06F 1/1615 345/30 |
| 7,310,050 | B2* | 12/2007 | Yeh .............. | G06F 1/1624 340/815.4 |
| 2003/0160892 | A1* | 8/2003 | Tamura .............. | H04N 5/2251 348/333.07 |
| 2005/0040962 | A1* | 2/2005 | Funkhouser .......... | G06F 1/1601 340/815.4 |

FOREIGN PATENT DOCUMENTS

| | | |
|---|---|---|
| JP | 10-178051 A | 6/1998 |
| JP | 2004-087858 A | 3/2004 |
| JP | 2006-071446 A | 3/2006 |
| JP | 2011-228602 A | 11/2011 |
| JP | 2013-082482 A | 5/2013 |

* cited by examiner

*Primary Examiner* — Anthony Haughton
(74) *Attorney, Agent, or Firm* — Birch, Stewart, Kolasch & Birch, LLP

(57) ABSTRACT

Provided is a method of managing a component mounting substrate that can be used in a roll-to-roll process, without breaking or deteriorating electronic components mounted thereon. In the method of winding, around a core, a flexible component mounting substrate on which a plurality of electronic components are mounted and managing the component mounting substrate as a roll, the roll is held such that the core of the roll is parallel to a vertical direction.

18 Claims, 6 Drawing Sheets

(a)

(b)

(a)

(b)

(a)

(b)

(a)

(b)

COMPONENT MOUNTING SUBSTRATE AND METHOD OF MANAGING COMPONENT MOUNTING SUBSTRATE

CROSS-REFERENCE TO RELATED APPLICATIONS

This application claims priority to Japanese Patent Application No. 2012-268887 filed on Dec. 8, 2012. The entire contents of this priority JP application are hereby incorporated by reference.

BACKGROUND OF THE INVENTION

1. Field of the Invention

The present disclosure relates to a method of managing a component mounting substrate.

2. Description of the Related Art

Conventionally, a method of continuously manufacturing a light emitting device in which LED chips are mounted on a flexible substrate according to a roll-to-roll process has been proposed (see Japanese Patent Application Publication No. 2011-228602).

In the flexible substrate used in the conventional method, it is considered that various electronic components such as LED chips are mounted. However, in the conventional method, during manufacturing of light emitting devices and/or storage and/or delivery of the light emitting devices after manufacturing, some of the electronic components may be broken or deteriorated.

SUMMARY OF THE INVENTION

In one embodiment of the present invention, a component mounting substrate managing method of winding, around a core, a flexible component mounting substrate on which a plurality of electronic components is mounted and managing the component mounting substrate as a roll, wherein the roll is held such that the core of the roll is parallel to a vertical direction.

DETAILED DESCRIPTION

Hereinafter, embodiments will be described with reference to the accompanying drawings.

Figure 1:
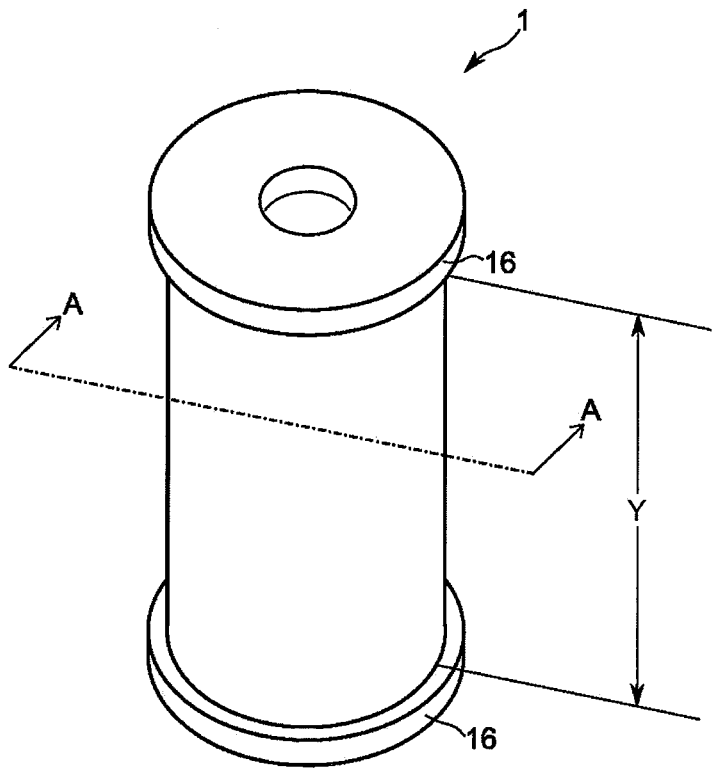
FIGS. 1A and 1B are diagrams illustrating a component mounting substrate managing method according to an embodiment.
Figure 1:
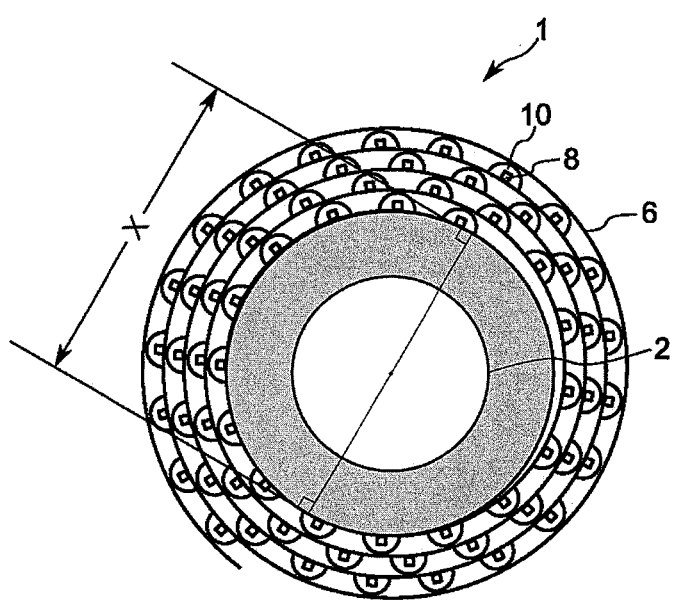

FIGS. 1A and 1B are diagrams illustrating a component mounting substrate managing method according to an embodiment, in which FIG. 1A is a perspective view and FIG. 1B is a diagram illustrating a cross-section along line A-A in FIG. 1A. In the following description, electronic components 8a, 8b, 8c, 8d, 8e, and the like are often referred to collectively as electronic components 8, and sealing members 10a, 10b, 10c, 10d, 10e, and the like are often referred to collectively as sealing members 10.

As illustrated in FIGS. 1A and 1B, in the embodiment, when a flexible component mounting substrate 6 on which a plurality of electronic components 8 are mounted is wound (rolled up) around a core 2 and managed as a roll 1, the roll 1 is held in such a way that the core 2 of the roll 1 is parallel to a vertical direction. The reasons therefore are as follows.

Figure 2:
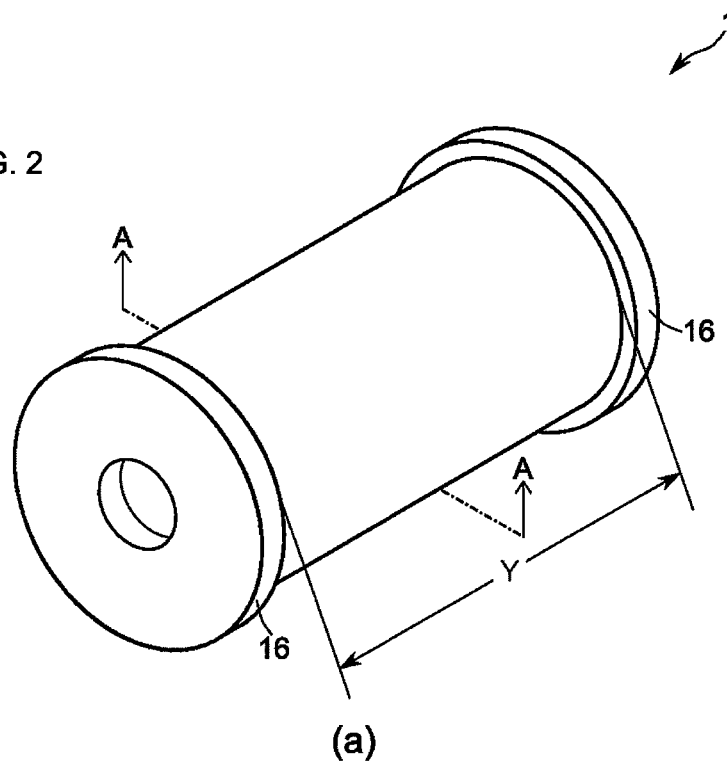
FIGS. 2A and 2B are diagrams illustrating a roll left in a horizontal state.
Figure 2:
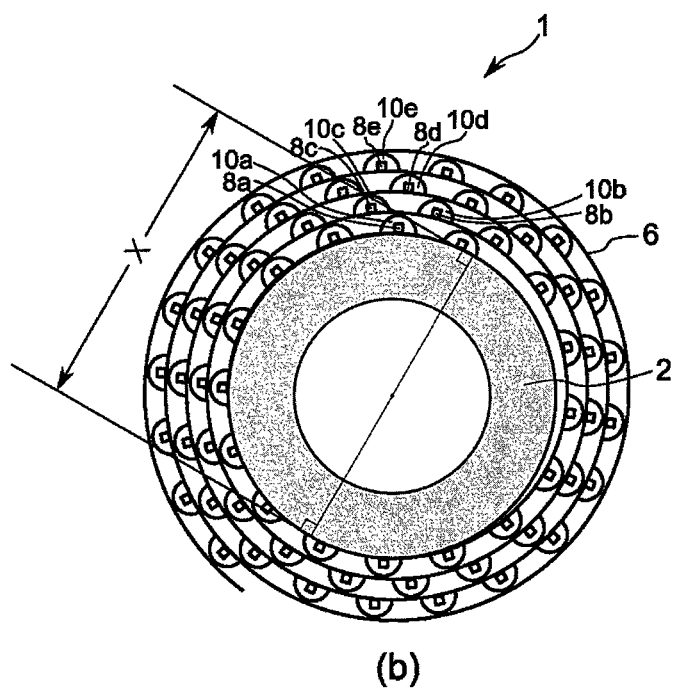

FIGS. 2A and 2B are diagrams illustrating a roll left in a horizontal state, in which FIG. 2A is a perspective view and FIG. 2B is a diagram illustrating a cross-section along line A-A in FIG. 2A.

In general, in the roll-to-roll process, the flexible component mounting substrate 6 on which a plurality of electronic components 8 are mounted is wound around the core 2 to form the roll 1, and is held in a horizontal state.

However, as illustrated in FIGS. 2A and 2B, if the roll 1 is left in the horizontal state, the plurality of electronic components (for example, the electronic components 8a, 8b, 8c, 8d, and the like) positioned above the core 2 and the sealing members (for example, the sealing members 10a, 10b, 10c, 10d, and the like) sealing these electronic components are sandwiched between portions of the component mounting substrate 6 positioned above these electronic components or the sealing members and the core 2 or the like positioned below the component mounting substrate 6 or the electronic component 8a, the sealing members 10a, and the like. Thus, the electronic components and the sealing members and the like continuously receive a load of the component mounting substrate 6 and the like positioned there above, and may be broken or deteriorated.

Therefore, in the embodiment, the roll 1 is held such that the core 2 of the roll 1 is parallel to a vertical direction. With this arrangement, since the plurality of electronic components 8 and the sealing members 10 sealing the electronic components 8 would not receive the load, it is possible to manage the component mounting substrate 6 that can be used in the roll-to-roll process, with less breaking or deteriorating of the electronic component 8 mounted thereon and the sealing members 10.

The respective members and the like will be described.

[Electronic Component]

As a electronic component 8, for example, a light emitting element, constituent elements that determines the driving current of a light emitting element driving circuit such as a fixed resistor, a transistor or the like, a fuse that prevents breaking by overcurrent, rectifier diode, a Zener diode and a varistor or the like for protecting a light emitting element from static electricity, and etc., can be used. Moreover, a connecting member such as a connector or a wire harness for supplying electric power from the outside of the component mounting substrate can also be used as the electronic component.

(Light Emitting Element)

A light emitting element as an example of the electronic component 8 can be a light emitting diode chip, a surface-mounted light emitting diode in which light emitting diode chips are packaged, a lamp-type light emitting diode, a chip-size-package type light emitting diode, and the like, for example. The light emitting diode chip includes a p-type semiconductor layer, an active layer that emits light, an n-type semiconductor layer, a p-side electrode electrically connected to the p-type semiconductor layer, and an n-side electrode electrically connected to the n-type semiconductor layer.

As the light-emitting diode chip, a light-emitting diode in which GaN-based semiconductor layers are stacked on a sapphire substrate and a p-side electrode and an n-side electrode are formed on the same surface is favorably used, for example. Preferably, an insulator may be provided between a mounting electrode and an electrode in contact with the semiconductor layer, and the mounting electrode is formed in an area larger than the electrode contacting the semiconductor layer. With this arrangement, since the force experienced to the light-emitting element can be supported by a larger area, it is possible to reduce defects of the light-emitting element.

When a light-emitting diode chip is used as the light-emitting element, the electrical connection between the light-emitting element and the outside of it is preferably realized by flip-chip manner in which the component mounting substrate 6 and the p-side electrode and the n-side electrode of the light-emitting element are connected so as to face each other, rather than using wires. With this arrangement, it is possible to prevent deformation or disconnection of wires or the like due to the load of the component mounting substrate 6 or the like in the state of being wound around the core 2 and to prevent defects of the light-emitting element.

Even when wires are used, the load of the component mounting substrate 6 in the state of being wound around the core 2 can be reduced and the possibility of deformation or disconnection of the wires can be reduced.

(Sealing Member)

The electronic components 8 are preferably sealed by the sealing members 10. With this arrangement, it is possible to protect the electronic components 8. When the electronic components 8 are light-emitting diode chips, it is particularly preferable to protect the electronic components 8 with the sealing members. The shape of the sealing members 10 are not particularly limited as long as the electronic components 8 can be sealed, but the sealing members 10 are provided in convex shapes on the component mounting substrate 6, for example.

When the electronic components 8 are light-emitting elements, materials having high translucency and light stability such as a silicone resin, a epoxy resin, or a glass can be favorably used as the sealing members 10 sealing the electronic components 8.

However, such materials generally have lower mechanical strength (specifically softer or more fragile) than sealing members used in sealing ordinary semiconductors (that do not emit light). Thus, in the conventional method, the sealing members may be broken or deteriorated by receiving the load of the component mounting substrate 6 and the other electronic components 8 and the like continuously in the state of being wound around the roll.

According to the embodiment, since it is possible to suppress such breaking and deterioration, materials having low mechanical strength can also be suitably used as the sealing members 10.

In the description, translucency of the sealing members means the ability to transmit 50% or more of light from the light-emitting element or light of which the wavelength is converted by a wavelength converting member.

The shape of the sealing members 10 are not particularly limited, but the configuration of the embodiment is particularly effective when a shape such as a hemispherical shape or a dome shape, such that the sealing member protrudes from the component mounting substrate. In other words, it is likely that the load of the component mounting substrate 6 or the like concentrates on the upper part of the sealing members 10, and is easily broken or deteriorated, especially in the case in which the upper part of the sealing member 10 is smaller than the lower part (the part close to the component mounting substrate). Therefore, the configuration of the embodiment is particularly effective in such a case. For example, the sealing member 10 having an approximately hemispherical shape of which the diameter is between approximately 3 mm and 4 mm and the height is between approximately 1 mm and 2 mm can be preferably used.

When the electronic components 8 are light-emitting elements, the sealing member 10 sealing the electronic component 8 may contain a wavelength converting member (specifically, a phosphor) that converts light from the light-emitting element into light having different wavelength. With this arrangement, since it is possible to provide various color tone and emission spectra including white and a bulb color, it is possible to cope with various market demands. For example, when a GaN-based light-emitting element and a YAG-based phosphor are used, the light-emitting element as the electronic components 8 can emit white light.

[Component Mounting Substrate]

Figure 3:
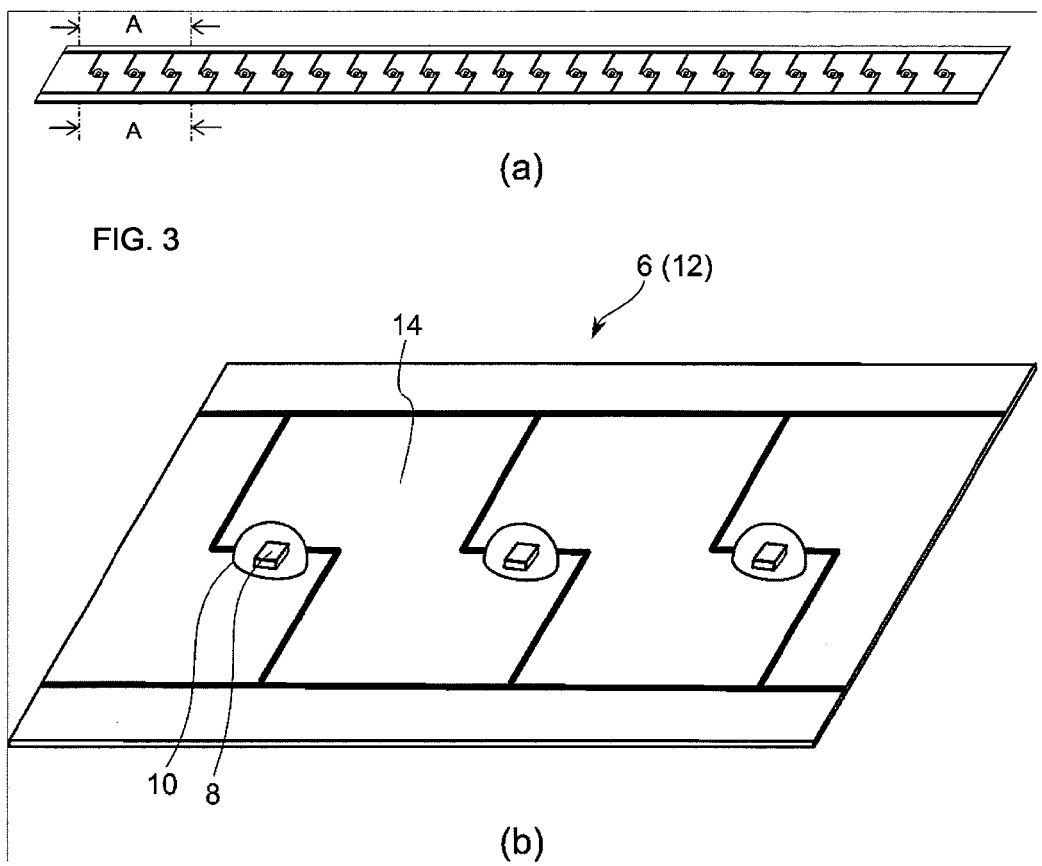
FIGS. 3A and 3B are diagrams illustrating a schematic configuration of a component mounting substrate according to an embodiment.

FIGS. 3A and 3B are diagrams illustrating a schematic configuration of a component mounting substrate according to the embodiment, in which FIG. 3A is a perspective view and FIG. 3B is an enlarged view of the portion A-A in FIG. 3A.

As illustrated in FIGS. 3A and 3B, the component mounting substrate 6 includes, for example, a flexible substrate 12 on which metal wiring patterns 14 are formed and electronic components (light-emitting diodes) 8 are mounted on the wiring patterns. The wiring patterns 14 are electrically connected to the electronic components 8. It is preferable that the component mounting substrate 6 has a side extending in the longitudinal direction and a side extending in the lateral direction and is wound around the roll 1 in such a way that the side extending in the lateral direction is along a width direction of the roll 1. In this manner, the component mounting substrate 6 can be easily wound around the roll 1.

The material that can be used for the substrate 12 is not limited, but ideally an insulating resin such as a polyimide resin, or a polyethylene-terephthalate resin is used. For example, the substrate 12 may be formed by a copper foil or an aluminum foil that has a narrow tape shape that is coated by an insulating resin.

The thickness of the substrate 12 may be approximately 10 μm to 100 μm, for example. The material of the substrate 12 can be appropriately selected by taking into consideration mountability of the electronic components 8, optical reflectance, adhesion to other members, and the like. For example, when solder is used in mounting the electronic components 8, it is preferable to use a polyimide resin having high heat resistance. When light-emitting elements are used as the electronic components 8 and a reflecting film described later is not provided on the substrate 12, it is preferable to use a material having high optical reflectance (for example, a white material).

A metal foil such as a copper foil or an aluminum foil, for example, can be used as the wiring pattern 14.

Figure 4:
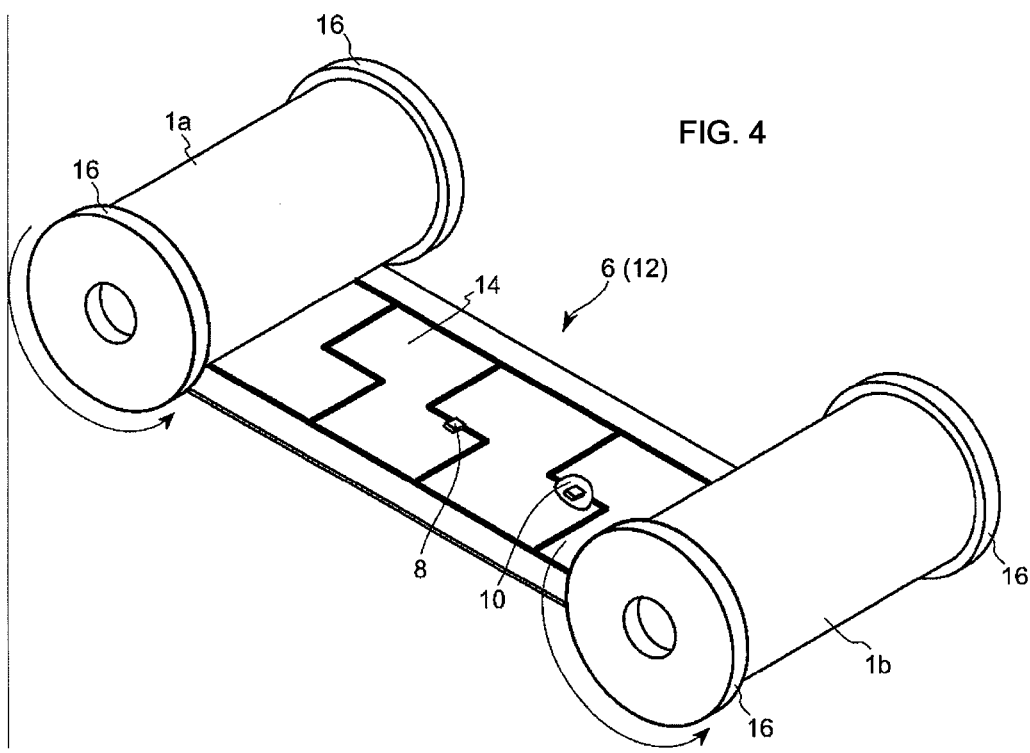
FIG. 4 is a diagram illustrating an example of how a component mounting substrate, on which a plurality of electronic components are mounted, is wound around a roll according to a roll-to-roll process.

FIG. 4 is a diagram illustrating an example of how a component mounting substrate on which a plurality of electronic components are mounted is wound around a roll according to a roll-to-roll process.

First, a roll 1a on one side is rotated, whereby the substrate 12 on which the wiring patterns 14 are unwound toward the other side, and the plurality of electronic components 8 are sequentially mounted on the portion of the substrate 12 that is unwound. And then, after these electronic components 8 are sequentially sealed by the sealing members 10, as illustrated in FIG. 4, the component mounting substrate 6 is wound around the core 2 on the other side to form a roll 1b. In the embodiment, a method of managing the roll 1b on the other side is described.

[Reflecting Film]

A reflecting film may be formed on the substrate 12. With this reflecting film, the light emitted from a light-emitting element can be efficiently reflected from the surface of the component mounting substrate 6.

As the reflecting film, an insulating resin that contains a white filler, white powder, or the like, and has high optical reflectance and high heat resistance and optical resistance is preferably used. Example of such a material include a silicone resin, a resist, or the like, that contains $TiO_2$.

[Roll Core]

As the core 2 of the roll 1, for example, a columnar or hollow cylinder formed from a paper roll in which a resin is impregnated, or hard plastics can be used. A relatively hard member is preferably used as the core 2 of the roll 1 in such a way that the core 2 of the roll 1 is stably held in parallel to a vertical direction.

The thickness X (for example, the diameter of the core 2 when the core 2 is a columnar or hollow cylinder) and the width Y of the core 2 are not particularly limited, but it is preferable that the thickness X of the core 2 is relatively large (for example, 150 mm or more) and the width Y of the core 2 is relatively small (for example, 500 mm or smaller). Moreover, the thickness X of the core 2 is preferably larger than the width Y. With this configuration, the core 2 of the roll 1 can be stably held in parallel to the vertical direction. For example, in FIG. 1A the roll 1 can be stably held such that the dimension Y is substantially vertical.

The width Y of the core 2 can be appropriately selected depending on factors such as a roll-to-roll manufacturing apparatus, the width of the component mounting substrate 6 to be wound, or the width of the light-emitting device manufactured from the component mounting substrate, and the like. Preferably, the width Y can be approximately 500 mm from the perspective of suppressing an increase of the size the manufacturing apparatus and an unnecessary reduction of the materials. If the thickness X of the core 2 is too large, the outer size of the roll 1 increases and a large space is required during storage and delivery, so it is preferable that the thickness X is between approximately 100 mm and 200 mm. In this case, the width Y of the core 2 is larger than the thickness X of the core 2.

The component mounting substrate 6 can be manufactured in a large width at first and wound as a roll, and after that, can be divided in a small width to obtain a plurality of light-emitting devices or the like. Specifically, a plurality of patterns serving as the substrates of the light-emitting devices may be formed in a width direction of the component mounting substrate 6, and the component mounting substrate 6 may be cut using a cutter/slitter or the like after the electronic components are mounted. In this way, a plurality of light-emitting devices or the like can be obtained.

The way of reeling the roll 1 is not particularly limited, but it is preferable to reel the roll 1 in such a way that the electronic components 8 or the sealing members 10 face the outer side of the roll so that the deformation of the sealing member 10 positioned in the inner circumference (the side close to the core 2) is diminished.

A surface of the core 2 contacting the component mounting substrate 6 is preferably smooth so that winding and unwinding of the component mounting substrate 6 are not impaired. It is preferable that the friction between the core 2 and the component mounting substrate 6 is relatively large, and specifically, that the portions contacting with each other are made from resins. With this arrangement, even when the roll 1 is stored in a standing state, it can prevent the component mounting substrate 6 and the core 2 from slipping on each other.

The core 2 preferably has fixing members 16 at both ends of the wound component mounting substrate 6 so that winding slippage of the component mounting substrate 6 is eliminated. Such a fixing member 16 preferably has a planar shape from the perspective of reducing a storage space. Examples of such material include a paper board, a resin-impregnated paper board, a hard plastic board, and the like. The fixing member (plate) 16 is preferably provided so as to protrude in an outward direction of the roll more than the wound component mounting substrate. With this arrangement, it is possible to reduce winding slippage.

The fixing member 16 preferably has a disc shape as illustrated in the drawings, so that the fixing member 16 can be easily rotated when the component mounting substrate 6 is winding or unwinding. The fixing member 16 may be integrated with the core 2 or may be formed as a separate member from the core 2. The fixing member 16 may be formed in the core 2 after the winding. When a hollow cylinder is used as the core 2, a hole is preferably formed in the fixing member 16 so as to fit the core 2. With this arrangement, a holding member 18 described later can be inserted in the core 2 while providing the fixing member 16.

[Holding Member]

Figure 5:
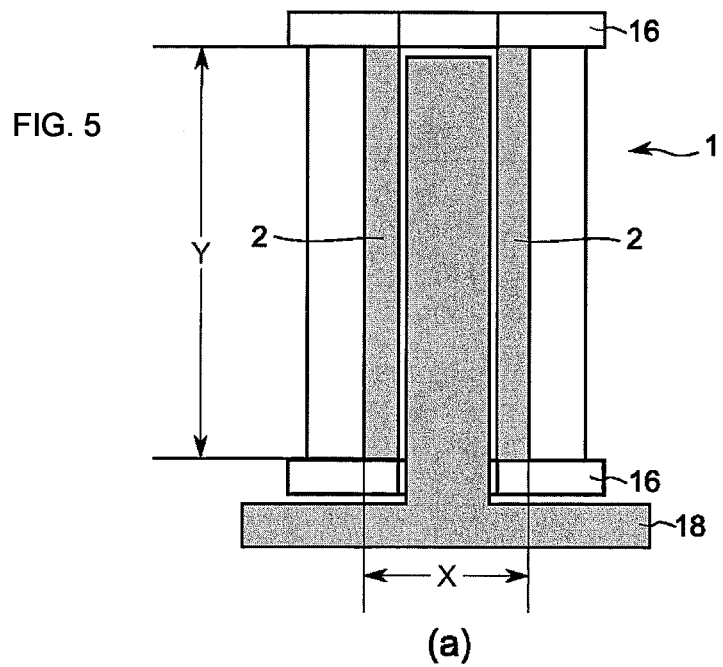
FIGS. 5A and 5B are diagrams for describing a holding member according to an embodiment.
Figure 5:
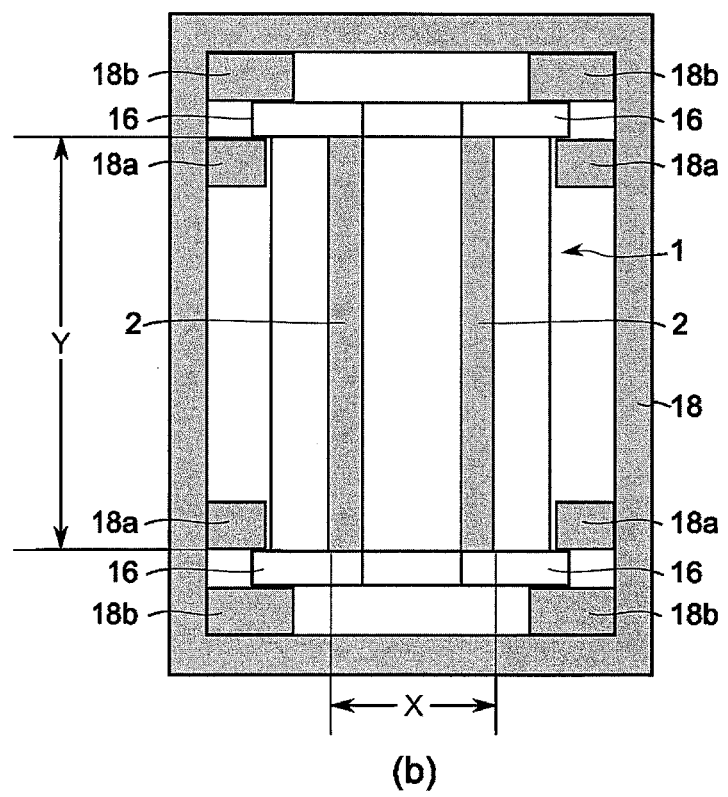

FIGS. 5A and 5B are diagrams for describing a holding member according to the embodiment, in which FIG. 5A is a diagram illustrating an example of the holding member and FIG. 5B is a diagram illustrating another example of the holding member.

As illustrated in FIGS. 5A and 5B, the roll 1 is held by the holding member 18 that holds the roll 1, with the core 2 of the roll 1 being parallel to the vertical direction. The holding member 18 can be made of materials such as paper, resin-impregnated paper, plastics, styrene foam, and the like or combinations of such materials, for example.

As illustrated in FIG. 5A, when a hollow cylinder is used as the core 2, a rod-shaped member that can be inserted in the cylindrical core 2 can be used as the holding member 18, for example. With this arrangement, it is possible to stably hold the roll 1.

As illustrated in FIG. 5B, when the fixing member 16 is provided at both ends of the roll 1, a member including hooking portion 18a and 18b capable of hooking on the fixing member 16 can be used as the holding member 18. With this arrangement, it is possible to stably hold the roll 1.

The holding member 18 provided below the roll 1 is preferably provided so as to extend from a bottom of the component mounting substrate 6 of the roll 1 up to near the core 2. With this arrangement, the weight of the wound component mounting substrate 6 can be supported by the holding member 18 and the storage of the roll 1 can be easy. More preferably, the holding member 18 is provided on the entire bottom surface of the roll 1. This arrangement is preferable because the weight of the roll 1 can be supported.

[Management]

Management includes various forms of management such as management during storage of goods-in-progress, management during storage of finished goods, management during shipping and delivery, or management during storage in a destination warehouse.

EXAMPLE

Figure 6:
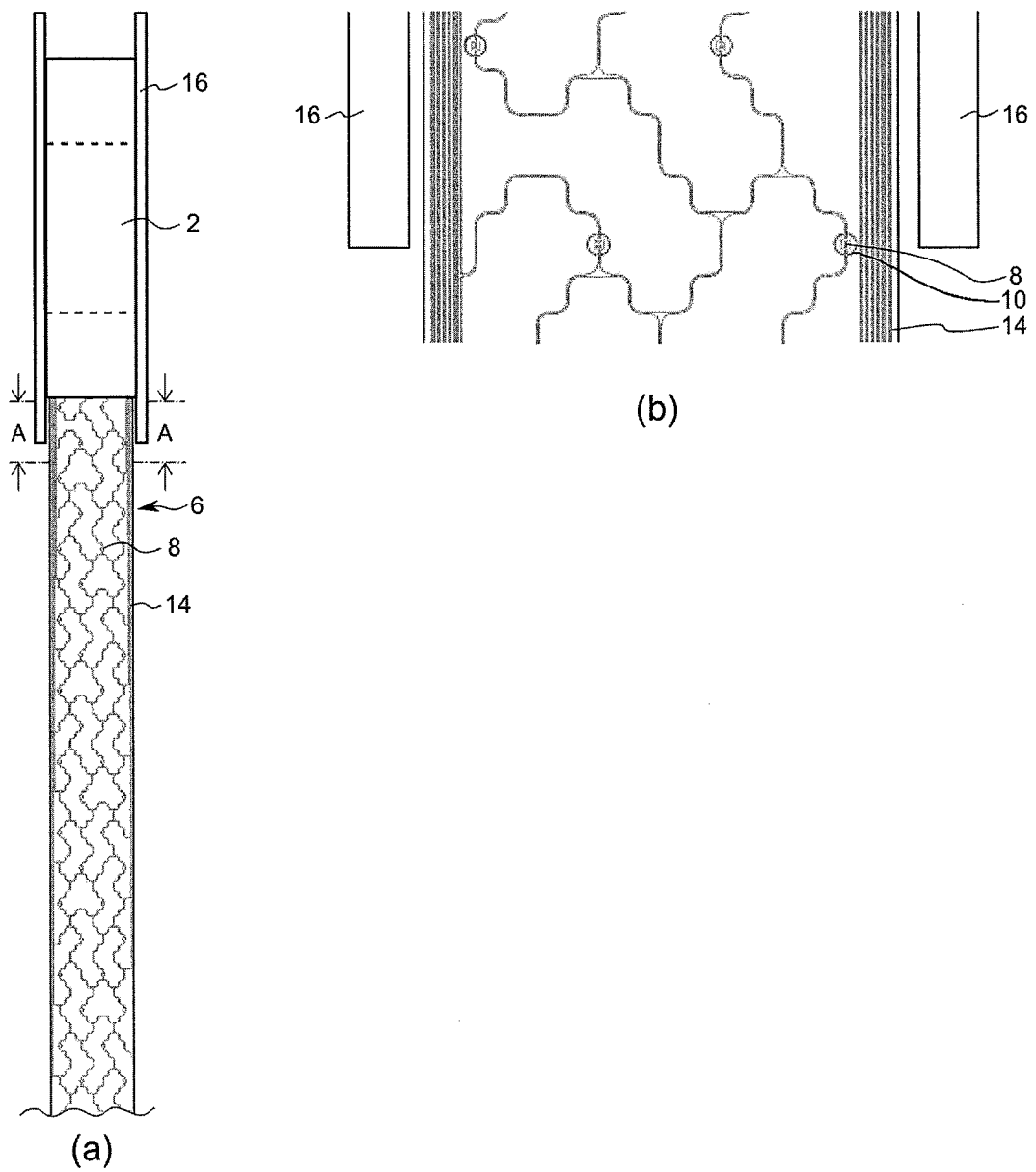
FIGS. 6A and 6B are diagrams illustrating how a component mounting substrate is wound around a core according to a example.

FIGS. 6A and 6B are diagrams illustrating how a component mounting substrate is wound on a core according to an example, in which FIG. 6A is a schematic view and FIG. 6B is an enlarged view of a region indicated by "A" in FIG. 6A.

In the example, a cylinder having a thickness of 150 mm and a width of 80 mm is used as the core 2. A film-shaped substrate having a width of 75 mm, a thickness of 0.1 mm, and a length of 680 mm is used as the component mounting substrate 6. A disc-shaped member having a diameter of 380 mm is used as the fixing member 16, and light-emitting diodes (light-emitting diode chips) are used as the electronic components 8. A plurality of component mounting substrates 6 is wound approximately ten to thirty turns in total around the core 2.

As illustrated in FIGS. 6A and 6B, wiring patterns 14 is formed so as to extend from both ends in the longitudinal direction of the component mounting substrate 6. With this arrangement, it is easy to wind the component mounting substrate 6 around the core 2.

FIGS. 6A and 6B illustrate an example in which electronic components 8 are arranged along two lines in the lateral direction of the component mounting substrate 6, but electronic components 8 may be arranged along one line or along three or more lines.

Figure 7:
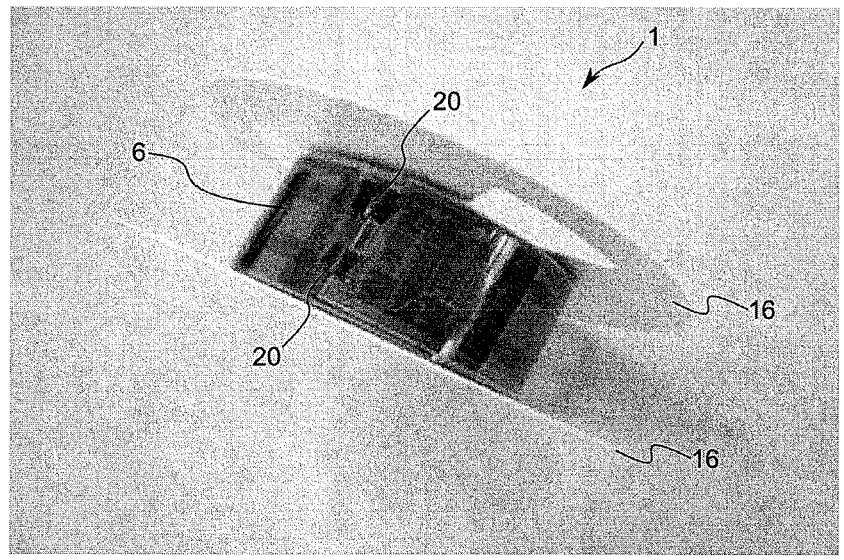
FIG. 7 is a diagram illustrating a state in which component mounting substrates have been rolled up around a core according to the example.

FIG. 7 is a diagram illustrating a state in which the component mounting substrates is rolled up around the core according to the example.

In the example, winding (initial winding) around the core 2 starts by winding a dummy substrate (for example, a substrate on which no electronic component is mounted) one turn around the core 2. In this case, one end of the dummy substrate is fixed to the core 2 by a tape.

Subsequently, one end of the first component mounting substrate 6 is fixed to the other end of the dummy substrate by a tape in such a way that the electronic components 8 and the sealing members 10 face the inner side of the roll 1, and the component mounting substrate 6 is wound around the core 2.

Subsequently, one end of the second component mounting substrate 6 is fixed to the other end of the first component mounting substrate 6 by a tape, and the second component mounting substrate 6 is wound around the core 2 in a manner similarly to the first component mounting substrate 6. By repeating this, approximately ten to twenty components mounting substrates 6 are wound around the core 2. With this arrangement, a plurality of component mounting substrates 6 are wound approximately ten to thirty turns around the core 2.

After that, as illustrated in FIG. 7, the other end of the last component mounting substrate 6 is fixed to the outermost circumference of the roll 1 by a tape 20. The tape as used herein is preferably an adhesive tape.

Figure 8:
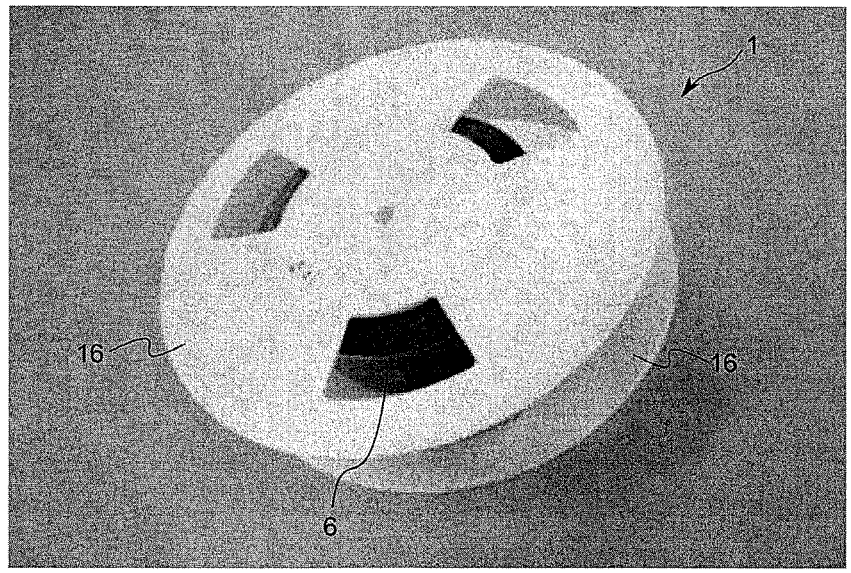
FIG. 8 is a diagram illustrating a roll managed according to the method of the example.

FIG. 8 is a diagram illustrating a roll managed by the method according to the example.

After the component mounting substrates 6 are rolled up around the core 2 in the above-described manner, the roll 1 is held such that the core 2 is parallel to the vertical direction as illustrated in FIG. 8. And then, the component mounting substrates 6 are shipped in this state.

According to the component mounting substrate managing method according to the example described above, it is possible to manage a component mounting substrate that is used in a roll-to-roll process, without breaking or deteriorating the electronic components mounted thereon.

While an embodiment and examples have been described above, it is to be understood that the descriptions merely present examples and are not to be construed as limiting the present invention in any way.

DENOTATION OF REFERENCE NUMERALS

1: roll
1a: roll
1b: roll
2: core
6: component mounting substrate
8: electronic component
8a: electronic component
8b: electronic component
8c: electronic component
8d: electronic component
8e: electronic component
10: sealing member
10a: sealing member
10b: sealing member
10c: sealing member
10d: sealing member
10e: sealing member
12: substrate
14: wiring pattern
16: fixing member
18: holding member
18a: hooking means
18b: hooking means
20: tape
x: thickness of core 2
y: width of core 2

What is claimed is:

1. A method of managing a plurality of light emitting elements using a component mounting substrate which has a substantially flat surface having sides extending in lateral and longitudinal directions, respectively, the method comprising:
holding a roll into which the component mounting substrate has been formed as a result of the component mounting substrate having been wound around a core such that the side extending in the lateral direction is parallel to the core, the roll being held such that the core of the roll and the side of the surface extending in the lateral direction are parallel to a vertical direction, the plurality of light emitting elements having been mounted at respective positions on the surface of the component mounting substrate along the longitudinal direction prior to the component mount structure having been wound.

2. The method of managing a plurality of light emitting elements according to claim 1, wherein
the light emitting elements are sealed by one or more sealing members on the component mounting substrate.

3. The method of managing a plurality of light emitting elements according to claim 1, wherein
the roll is held by at least one holding member that holds the roll.

4. The method of managing a plurality of light emitting elements according to claim 2, wherein
the roll is held by at least one holding member that holds the roll.

5. The method of managing a plurality of light emitting elements according to claim 1, wherein the component mounting substrate further includes the reflecting film.

6. The method of managing a plurality of light emitting elements according to claim 2, wherein the one or more sealing members contain a wavelength converting member.

7. The method of managing a plurality of light emitting elements according to claim 1, wherein the light-emitting elements are mounted by flip-chip manner.

8. The method of managing a plurality of light emitting elements according to claim 1, wherein a thickness of the core is larger than a width of the core.

9. The method of plurality of light emitting elements according to claim 2, wherein the light emitting elements are sealed by respective sealing members.

10. A component mounting substrate, comprising:
a substantially flat surface having sides extending in lateral and longitudinal directions, respectively;
a plurality of light emitting elements mounted at respective positions on the surface along the longitudinal direction, wherein,
the component mounting substrate is wound around a core to be managed as a roll, the component mounting substrate being wound such that the side of the surface extending in the lateral direction is parallel to the core, and
the roll is managed so as to be held with the core of the roll and the side of the surface extending in the lateral direction being parallel to a vertical direction.

11. The component mounting substrate according to claim 10, wherein
one or more sealing members that seal the electronic components are provided on the component mounting substrate.

12. The component mounting substrate according to claim 10, wherein
the roll is held by a holding member that holds the roll.

13. The component mounting substrate according to claim 11, wherein
the roll is held by a holding member that holds the roll.

14. The component mounting substrate according to claim 10, wherein the component mounting substrate further includes the reflecting film.

15. The component mounting substrate according to claim 11, wherein the one or more sealing members contain a wavelength converting member.

16. The component mounting substrate according to claim 10, wherein the light-emitting elements are mounted by flip-chip manner.

17. The component mounting substrate according to claim 10, wherein a thickness of the core is larger than a width of the core.

18. The component mounting substrate according to claim 11, wherein the light emitting elements are sealed by respective sealing members.

* * * * *